(12) United States Patent
Park et al.

(10) Patent No.: US 12,366,591 B2
(45) Date of Patent: Jul. 22, 2025

(54) MULTI-CHANNEL SPECTRUM ANALYZER WITH MULTI-CHANNEL ANALOG-DIGITAL-CONVERTERS (ADCs)

(71) Applicant: VIAVI SOLUTIONS INC., Chandler, AZ (US)

(72) Inventors: Chang-Hyun Park, Goyang-si (KR); Bon-Jin Ku, Seoul (KR); Seung-Gon Hong, Incheon (KR)

(73) Assignee: VIAVI SOLUTIONS INC., Chandler, AZ (US)

( * ) Notice: Subject to any disclaimer, the term of this patent is extended or adjusted under 35 U.S.C. 154(b) by 527 days.

(21) Appl. No.: 17/850,120

(22) Filed: Jun. 27, 2022

(65) Prior Publication Data

US 2023/0417799 A1    Dec. 28, 2023

(51) Int. Cl.
*G01R 13/02* (2006.01)
*G01R 23/167* (2006.01)
*G01R 31/00* (2006.01)

(52) U.S. Cl.
CPC ....... *G01R 13/0272* (2013.01); *G01R 23/167* (2013.01); *G01R 31/001* (2013.01)

(58) Field of Classification Search
CPC .......................... G01R 13/0272; G01R 23/165; G01R 23/167; G01R 23/16; G01R 31/001; G01R 31/31725; G01R 31/31727; G01R 27/28; H03M 1/121; G06F 2218/00; G06F 2218/08; G06F 1/022; G06F 17/18; G01J 3/28; G01S 3/043; G01S 3/74; G01S 3/02

USPC .......... 73/659, 602; 324/76.19, 76.21, 76.15, 324/76.12; 340/659; 702/66, 190, 189, 702/76, 69, 57, 67, 70, 71, 75, 58, 60, 64, 702/77, 32, 79, 127, 108, 111, 17

See application file for complete search history.

(56) References Cited

U.S. PATENT DOCUMENTS

| | | | |
|---|---|---|---|
| 8,155,904 B2* | 4/2012 | Dvorak | H04B 17/101 |
| | | | 702/66 |
| 2011/0103452 A1* | 5/2011 | Park | G01S 5/04 |
| | | | 375/228 |
| 2014/0064349 A1* | 3/2014 | Park | G01S 3/046 |
| | | | 375/228 |
| 2019/0003888 A1* | 1/2019 | Detofsky | G01J 3/28 |

FOREIGN PATENT DOCUMENTS

CN            111610393 A  *  9/2020  ............. G01R 13/00

* cited by examiner

*Primary Examiner* — Jeffrey P Aiello
(74) *Attorney, Agent, or Firm* — Mannava & Kang, P.C.

(57) ABSTRACT

A multi-channel analog-digital converter (ADC) subsystem for test device such as a spectrum analyzer may include multiple multi-channel ADCs to receive down-converted signals and convert the received signals to digital output signals, a field programmable gate array (FPGA) to select one or more ADCs based on a frequency, a bandwidth, and/or a signal type of each received signal and a characteristic of each ADC, and an ADC sample clock to provide a clock signal to the selected ADCs. Characteristics of the ADCs may include a resolution, a signal-to-noise-and-distortion ratio (SINAD), an effective number of bits (ENOB), a signal-to-noise ratio (SNR), a total harmonic distortion (THD), a total harmonic distortion plus noise (THD+N), and/or a spurious free dynamic range (SFDR).

20 Claims, 7 Drawing Sheets

MULTI-CHANNEL SPECTRUM ANALYZER WITH MULTI-CHANNEL ANALOG-DIGITAL-CONVERTERS (ADCs)

TECHNICAL FIELD

This patent application is directed to spectrum analyzers, and more specifically, a multi-channel spectrum analyzer with multi-channel analog-digital-converters (ADCs), where ADC(s) are selected for use based on input radio frequency (RF) signal and bandwidth.

BACKGROUND

A cell site, also known as a cell tower or cellular base station, includes an antenna and electronic communications equipment to support cellular mobile device communication. The antenna and equipment are typically placed in connection with a radio mast or tower, and the equipment generally connects cell site air interfaces to wireline networks, which may be comprised of fiber optic cables and coaxial cables. When setting up or maintaining a cell site, technicians use, among other test devices, spectrum analyzers, typically portable spectrum analyzers, to test signal strength, frequency, phase, interference, etc.

At a cell site, there may be a variety of signals depending on technology, e.g., 4G Long Term Evolution (LTE), 5G New Radio (NR), Dynamic Spectrum Sharing (DSS), etc. Additionally, other signals such as Citizens Broadband Radio Service (CBRS) and similar communication signals may also be present and potentially interfere with the cellular network signals. Configuring instruments to evaluate the RF performance of the channel under test in these environments where channels are dynamically assigned at different locations may be a time-consuming process for RF engineers. Furthermore, depending on the configuration of the spectrum analyzer, accurate analysis of detected signals may be a challenge.

BRIEF DESCRIPTION OF DRAWINGS

Features of the present disclosure are illustrated by way of example and not limited in the following Figure(s), in which like numerals indicate like elements, in which.

DETAILED DESCRIPTION

Figure 1:
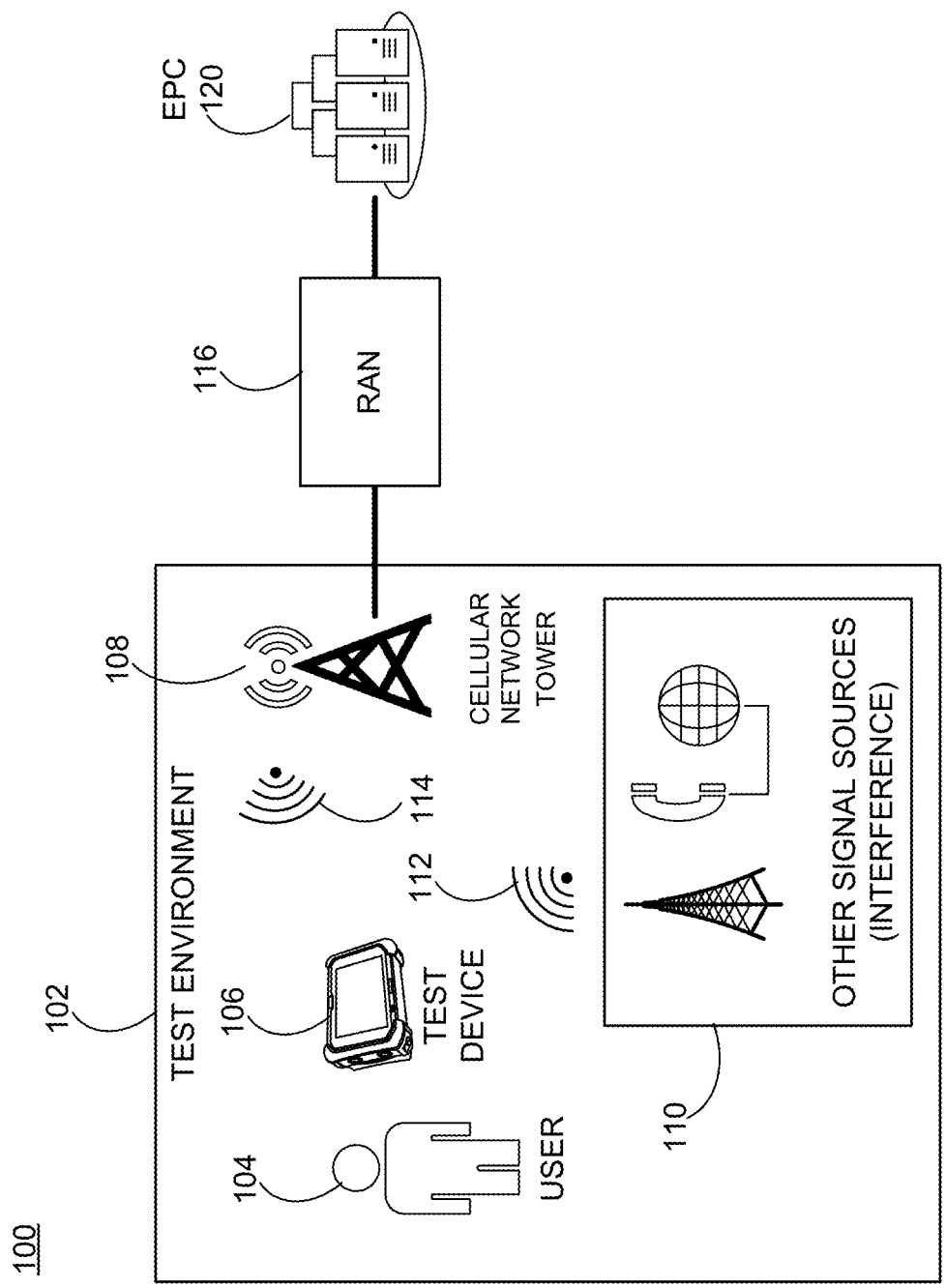
FIG. 1 illustrates a diagram of a test device in a test environment, according to an example.

For simplicity and illustrative purposes, the present disclosure is described by referring mainly to examples and embodiments thereof. In the following description, numerous specific details are set forth in order to provide a thorough understanding of the present disclosure. It will be readily apparent, however, that the present disclosure may be practiced without limitation to these specific details. In other instances, some methods and structures readily understood by one of ordinary skill in the art have not been described in detail so as not to unnecessarily obscure the present disclosure. As used herein, the terms "an" and "an" are intended to denote at least one of a particular element, the term "includes" means includes but not limited to, the term "including" means including but not limited to, and the term "based on" means based at least in part on.

As mentioned herein, when performing test and analysis for cell site equipment RF technicians may need spectrum analyzers and similar test devices that can process multiple input signals with different frequencies, bandwidths, and types. For example, one signal may be a cellular network signal in GHz frequency range and broad bandwidth, while another signal may be a lower frequency (e.g., MHz range), low bandwidth interfering signal, a harmonic of which may degrade the cellular network signal. When a single multi-channel ADC is used to convert the input signals to digital signals, the ADC's performance characteristics may not allow optimum performance for all input signals. For example, a signal-to-noise ratio (SNR) of the ADC may be sufficiently high for a high frequency, narrow bandwidth signal (e.g., 2.4 GHz, 25 MHz), but unacceptable for a low frequency, high bandwidth signal (e.g., 300 MHz, 100 MHz) provided to the ADC at the same time. Thus, high performance functions with various frequency and various bandwidths for 6 GHz (and above) may be a challenge in spectrum analyzers.

In some examples of the present disclosure, a test device such as a spectrum analyzer may include a multi-channel ADC subsystem, which may include a number of multi-channels ADCs with differing characteristics. ADC characteristics may include, but are not limited to, resolution, signal-to-noise-and-distortion ratio (SINAD), effective number of bits (ENOB), signal-to-noise ratio (SNR), total harmonic distortion (THD), total harmonic distortion plus noise (THD+N), and spurious free dynamic range (SFDR). Along with two or more input signals with different frequencies, bandwidths, and/or signal types, the test device may also receive a user selection for frequency, bandwidth, and/or signal type of the received input signals. A frequency of the input signal, as used herein, may refer to a center frequency of the signal with the bandwidth (i.e., frequency range of channel) centered around the frequency. A signal type, also referred to as "technology", may refer to a category of signal. For example, the signal may be a 4G LTE, 5G NR, 6G, DSS, LTE-FDD, LTE-TDD, NR, DSS-FDD, DSS-TDD signal, where FDD is frequency division duplex and TDD is time division duplex. The signal type may be associated with a specific set of center frequencies and bandwidths, along with a modulation of the signal.

The input signals may be down-converted at a mixer, and the down-converted signals provided to the multi-channel ADC subsystem. Down-conversion is the process of mixing the carrier signal (center frequency of the input signal) with a local oscillator signal to create an intermediate frequency (IF) signal for ease of processing, circuit implementation, and accuracy in processing the down-converted signal. The analog IF signal may then be digitized by one or more analog digital converters (ADCs) for digital processing by downstream circuitry. An FPGA managing the multi-channel ADC subsystem may select one or more suitable ADCs based on the input signal characteristics (frequency, bandwidth, signal type) and ADC characteristics (resolution, SINAD, ENOB, SNR, THD, THD+N, and/or SFDR) to optimize analog-digital conversion and an overall performance of the test device. A central processing unit (CPU) of the test device or the FPGA itself may also set/adjust an ADC sample clock circuit to provide appropriate clock signals to the selected ADC(s). The selected ADC(s) may then perform the conversion and provide the digital output signals to other circuits and subsystems of the test device through the FPGA for further processing and/or test and analysis related functionalities.

Some advantages and benefits of the systems and methods described herein are readily apparent. For example, selecting and employing an ADC with certain enhanced characteristics for a particular signal type (and/or frequency, bandwidth) may improve an accuracy of the analog-digital conversion, and thereby, an overall performance of the test device. Accurate testing and analysis of network signals and any interfering signals, in turn, may improve overall performance of a communications network. Other benefits and advantages may also be apparent.

FIG. 1 illustrates a diagram 100 of a test device 106 in a test environment 102, according to an example. As shown in the diagram 100, a user 104 may use a test device 106 to test and analyze signals 114 from a cellular network tower 108, as well as other signals 112, which may come from other signal sources 110 such as a radio tower, telecom signals, and others, which may interfere with the signals 114 from the cellular network tower 108. The cellular network tower 108 may be part of a cell site and connected to backhaul via a radio access network (RAN) 116 and the backhaul may connect to Evolved Packet Core (EPC) 120.

A connection between the cellular network tower 108 and the rest of the world may be referred to as a backhaul link or simply backhaul. A backhaul may include wired, fiber optic and wireless components, such as microwave transmission equipment. In conventional 3G and 4G architectures, fronthaul is associated with a RAN 116 architecture including centralized base band units (BBUs), i.e., baseband controllers, and standalone remote radio heads (RRHs) installed at remote cell sites. These BBU and RRH functional blocks, as well as the equipment that performs these functions, are located further away from each other than in prior mobile backhaul models. In some instances, the RRH and BBU are at the same location. In other instances, the RRH is located at the cell site, whereas the BBU is located in a centralized and protected location where it serves multiple RRHs. The optical links that interconnect the BBU and the multiple RRHs are referred to as fronthaul. The fronthaul includes interfaces between the RRH and the BBU. The backhaul includes interfaces between the BBU and the EPC 120.

In an example, the test environment 102 may include the cell site, which includes the cellular network tower 108 or cellular base station having antennas and electronic communications equipment to support cellular mobile device communication. The antennas and equipment are typically placed in connection with a radio mast or tower, and the equipment generally connects cell site air interfaces to wireline networks, which may be include fiber optic cables and coaxial cables. Typically, the cell site may be connected to backhaul via the RAN 116 and the backhaul may connect to the EPC 120.

The RAN is the part of a mobile network that connects end-user devices, like smartphones, to the cloud. This is achieved by sending information via radio waves from end-user devices to a RAN's transceivers, and finally from the transceivers to the core network which connects to the global internet. Diagram 100 shows the test device 106 performing signal analysis. In an example, the user 104, such as a cellular service provider technician, may use the test device 106 to perform signal analysis for discovered carrier frequency and technology as well as discovered channels of selected technologies. Furthermore, interference hunting and beam centric electromagnetic field (EMF) testing on a selected carrier may be performed with the test device 106. In an example use case, the testing may be performed when the cell site is being installed, such as to ensure proper operation of the cell site with user devices, such as smartphones or other end user cellular devices. In another example use case, after installation, customers of the cellular service provider may be having technical issues, and the user 104 may use the test device 106 to check for signal interference from the other signal sources 110 or other potential causes of the technical issues so the technical issues can be resolved.

As discussed above, the test device 106 may be operable to perform an analysis on selected channels (by the user 104 or automatically). Carrier frequencies of available channels for one or more technologies may also be detected automatically or by the user 104. The carrier frequencies may be a center frequency and/or a synchronization signal block (SSB) frequency depending on the technology. The technologies may include, but are not limited to, 4G LTE, 5G NR, and DSS. Additional examples of the technologies may include LTE-FDD, LTE-TDD, NR, DSS-FDD, DSS-TDD where FDD is frequency division duplex and TDD is time division duplex.

Accurate testing and analysis of network signals and any interfering signals may improve overall performance of a communications network. However, supporting high performance functions with various frequency and bandwidths, especially at and above 6 GHz, may be a challenge for spectrum analyzers. While analysis of various signals involves a number of components and their respective performance characteristics in the test device 106, ADC performance may be a substantial contributor to accurate analysis or lack thereof. In some examples, multiple ADCs and RF paths may be provided in the test device 106 and the ability to analyze multiple signals simultaneously selecting optimal performance ADCs for the task, thus increasing an overall efficiency and performance of the spectrum analyzer (test device 106).

Figure 2:
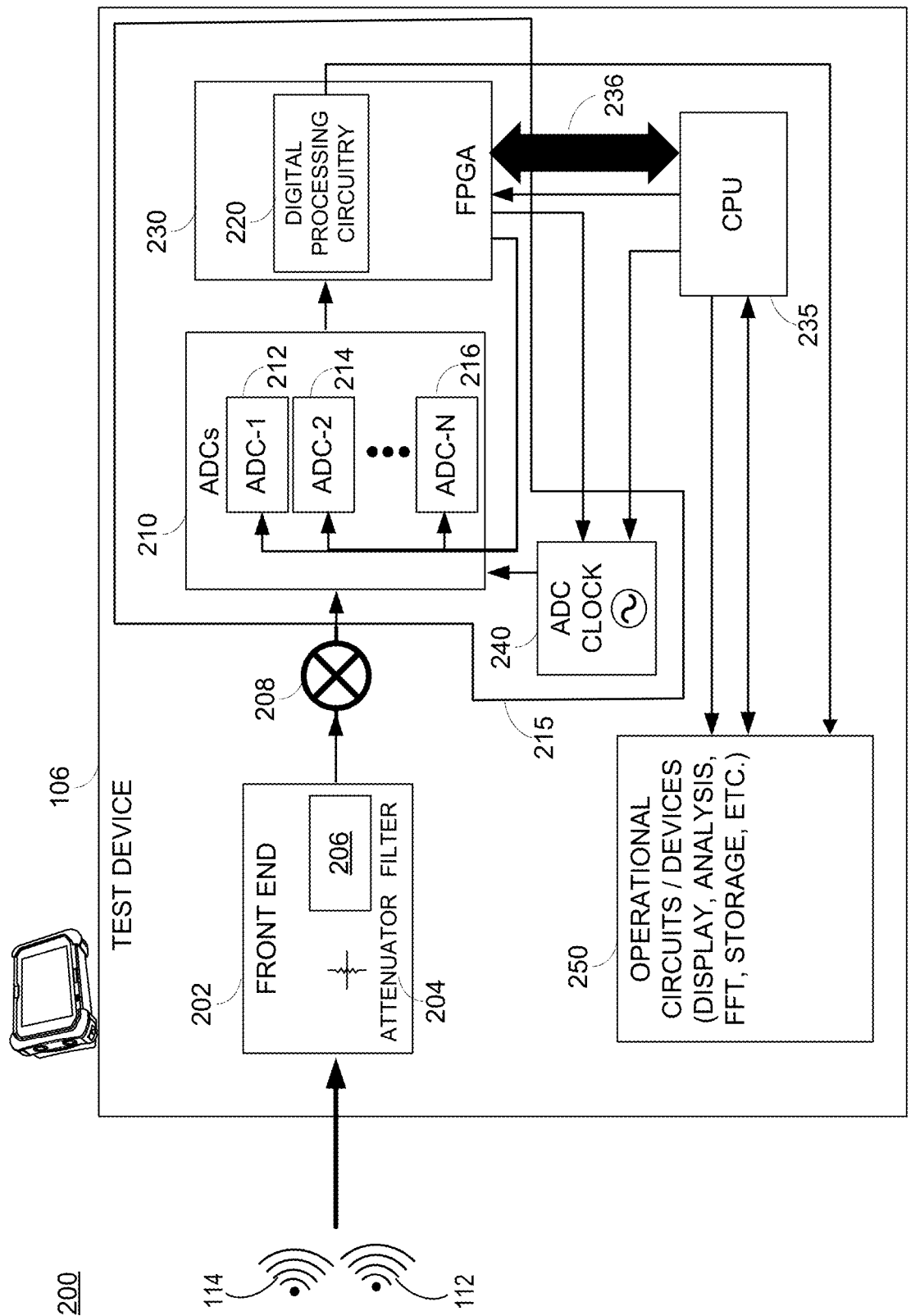
FIG. 2 illustrates a block diagram of major components of the test device including a multi-channel ADC subsystem managed by a field programmable gate array (FPGA), according to an example.

FIG. 2 illustrates a block diagram 200 of major components of the test device 106 including a multi-channel ADC subsystem 215 managed by a field programmable gate array (FPGA) 230, according to an example. As block diagram 200 shows, the signals 114 (from the cellular network tower 108) and the other signals 112, which may be interference signals, may be input to the test device 106 and pre-processed by a front end 202. The front end 202 may include, among other circuits and subsystems, an attenuator 204 and a filter 206. The attenuated and filtered signal (pre-processed RF signal) may be down-converted at a mixer 208, and the down-converted signal provided to ADCs 210 of the multi-channel ADC subsystem 215. The multi-channel ADC subsystem 215 may include any number of multi-channel ADCs 210, such as ADC-1 212, ADC-2, 214, to ADC-N 216, the FPGA 230, and an ADC sample clock 240. The ADCs 210 may receive one or more clock signals from the ADC sample clock 240 to sample the input signal(s) and convert them to digital outputs. A CPU 235 may manage one or more components of the test device 106 such as ADC sample clock 240, FPGA 230, and at least some of the operational circuits and devices 250 (also referred to as operational subsystems).

In some examples, the multi-channel ADC subsystem 215 may be managed, that is, suitable ADCs selected for analog-digital conversion of input signals, by the FPGA 230. Digital output of the selected ADCs may be provided to digital processing circuitry 220, which may be partially or wholly implemented in the FPGA 230. The digital processing circuitry 220 may include detectors, normalizers, filters, etc. Digitally processed signals may be provided by the multi-channel ADC subsystem 215 to operational circuits and devices 250, which may perform analytical operations such as displaying the signals, fast Fourier transforms (FFTs), storing the signals and/or analysis results, and similar operations. Thus, the operational circuits and devices 250 may include an analysis subsystem, a display subsystem, an FFT subsystem, a storage subsystem, and comparable subsystems and circuits.

In some examples, the CPU 235 may communicate with other components over various interfaces and control their operations. For example, the CPU 235 may control the ADC sample clock 240 and set clock frequencies to be provided to selected ADCs. The ADC sample clock 240 may alternatively be controlled by the FPGA 230. The CPU 235 and the FPGA 230 may also communicate over a peripheral component interconnect (PCI) interface (interconnect 236). For example, processed (spectrum-analyzed) data may be transmitted by the FPGA 230 to the CPU 235 to be further processed and/or displayed.

As mentioned herein, the test device 106 may be a spectrum analyzer (for example, a portable spectrum analyzer to be used in the field) and may include additional circuitry and subsystems such as a voltage-controlled oscillator (VCO) for the mixer 208, additional filters, mixers, oscillators, a frequency synthesizer, and so on. Thus, the analog input signal(s) may be processed by any number of analog processing circuitry and the digital signals converted by the multi-channel ADC subsystem 215 may be processed by any number of digital processing circuitry.

It should be appreciated that FIG. 2 shows a simplified block diagram of major components of the test device 106. A test device such as a spectrum analyzer may be implemented with additional of fewer components, where certain functionality may be distributed among various components and sub-systems or performed by additional components or sub-systems. Furthermore, the test device 106 may be any RF test device including, but not limited to, a spectrum analyzer, a cellular system monitoring device, an RF power analyzer, etc.

Figure 3:
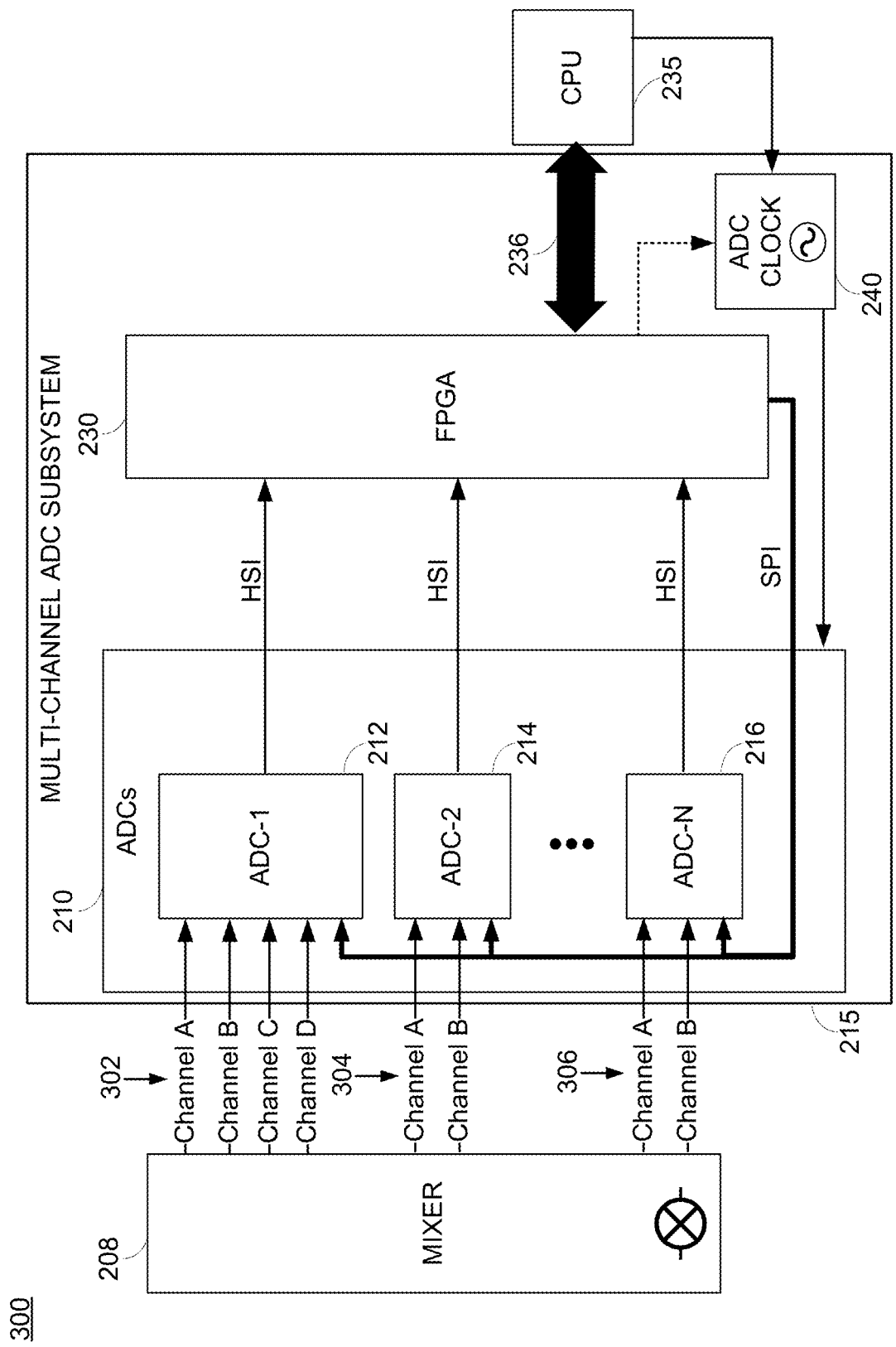
FIG. 3 illustrates a diagram of the multi-channel ADC subsystem managed by the FPGA, according to an example.

FIG. 3 illustrates a diagram 300 of the multi-channel ADC subsystem 215 managed by the FPGA 230, according to an example. The multi-channel ADC subsystem 215 and its components may be used with similar components shown in FIG. 2. As shown in diagram 300, multiple input signals may be received at a multiple channel test device (spectrum analyzer) and corresponding down-converted signals may be forwarded by the mixer 208 to one or more ADCs 210 in the multi-channel ADC subsystem 215. For example, four inputs may be forwarded as channels A, B, C, and D (302) to ADC-1 212; two inputs may be forwarded as channels A and B (304 or 306) to either ADC-2 214 or ADC-N 216.

Diagram 300 further shows CPU 235 communicatively coupled to the FPGA 230 through the PCI interface (interconnect 236) and connected to the ADC sample clock 240 to control clock frequencies provided to the selected ADCs. The ADC sample clock 240 may alternatively be controlled by the FPGA 230. Digitized IF signals from the ADCs 210 may be provided to the FPGA 230 over a high-speed data transfer interface (HSI). For example, the HSI may be a standard interface according to Joint Electronic Device Engineering Council "JEDEC" standard JESD204B/C. The transferred data may be processed and/or stored by the FPGA 230. The FPGA 230 may control (e.g., select, activate) ADCs through a lower bandwidth interface such as a serial peripheral interface (SPI), which is a synchronous serial communication interface used for short-distance communication, primarily in embedded systems.

In some examples, the mixer 208 may down-convert and provide one input signal at a time to the ADCs 210. Thus, multiple input signals may be processed serially with time multiplexing. In other examples, the mixer 208 may be a mixing subsystem and include two or more mixers, which may down-convert multiple RF signals to IF signals simultaneously. Thus, multiple IF signals may be provided to one or more ADCs in parallel. Digitized signals from the ADCs may be provided, as mentioned herein, through the HIS to various input ports of the FPGA 230. If the FPGA 230 does not have sufficient number of input ports, a multiplexer (not shown) may be used between the ADCs 210 and the FPGA 230.

In a practical implementation example, channel A may be 2195 MHz (with a bandwidth of 800 MHz), channel B may be 1200 MHz (with a bandwidth of 400 MHz), channel C may be 370 MHz (with a bandwidth of 200 MHz), and channel D may be 185 MHz (with a bandwidth of 100 MHz), all of which may be provided to a 4-channel ADC (ADC-1 212). In another practical implementation example, the 2195 MHz signal (with the bandwidth of 800 MHz) and the 1200 MHz signal (with the bandwidth of 400 MHz) may be provided as channels A and B to ADC-2 214 and the 370 MHz signal (with the bandwidth of 200 MHz) and the 185 MHz signal (with the bandwidth of 100 MHz) may be provided as channels A and B to ADC-N 216. Thus, in some examples an ADC (ADC-2 214) may be selected for larger bandwidth signals while another ADC (ADC-N 216) may be selected for smaller bandwidth signals. In other examples, the ADCs may be selected based on a frequency (center frequency) and/or type of each input signal. As mentioned herein, the ADCs may also be selected based on their characteristics (for a given input signal).

The FPGA 230 may select suitable ADC(s) within available ADCs 210 based on individual ADC characteristics. As mentioned above, multiple input signals may be received at a multiple channel test device (spectrum analyzer) with different frequencies and bandwidths. The signals may also be of different type (also referred to as technology) such as time division multiplexed, frequency division multiplexed, etc. Multi-channel ADCs typically convert each input channel sequentially using an input multiplexer. Certain applications may require simultaneous conversions, especially when phase information exists between different channels. For example, wireless applications may need I and Q channels to be converted at the same instance. In such scenarios, multiple ADCs and parallel conversions on each channel may be used. Alternatively, simultaneous sampling ADCs may perform simultaneous conversion using multiple track-and-hold (T/H) paths to sample the inputs at the same instant, then perform the conversion for each channel.

With the variety of types of ADCs, characteristics of ADCs may also vary across a broad range. Commonly used metrics for quantifying ADC characteristics include resolution, SINAD, ENOB, SNR, THD, THD+N, and/or SFDR. A resolution of the ADC is a number of bits the ADC uses to digitize the input samples. For an N bit ADC, the number of discrete digital levels that can be produced is 2N. For example, a 12-bit ADC may resolve 4096 levels. SINAD is the ratio of the rms signal amplitude to the mean value of the root-sum-square (rss) of all other spectral components, including harmonics, but excluding DC. ENOB may be derived from SINAD using the relationship for the theoretical SNR of an ideal N-bit ADC, which may be expressed as:

$$SNR = 6.02N + 1.76 \text{ dB} \quad (1)$$

Expression (1) may be solved for N, and the value of SINAD may be substituted for SNR, arriving at ENOB, which may be expressed as:

$$ENOB = (SINAD - 1.76 \text{ dB})/6.02 \quad (2)$$

THD is the ratio of the rms value of the fundamental signal to the mean value of the root-sum-square of its harmonics (generally, the first 5 harmonics are considered significant). THD+N is the ratio of the rms value of the fundamental signal to the mean value of the root-sum-square of its harmonics plus all noise components (excluding DC). SFDR is the ratio of the rms value of the signal to the rms value of the worst spurious signal regardless of where it falls in the frequency spectrum. The worst spurious signal may or may not be a harmonic of the original signal. SFDR may be an important specification in communications systems because it represents the smallest value of signal that can be distinguished from a large interfering signal.

Accordingly, different ADCs may be selected to convert different input signals to optimize accuracy depending on the input signal types, frequencies, and bandwidths. An ADC may be selected based on the frequency and bandwidth selected by the user. When the user enters the frequency and bandwidth of interest, an RF path and suitable ADC(s) may be selected by a matching table for optimal performance saved in the FPGA 230. For example, if the frequency is 6 GHz (corresponding RF IF: 2.2 GHz) and the bandwidth is 1 GHz, a channel A of ADC-1 212 may be selected by the saved matching table.

In some examples, an ADC selection based on an initial setting value may be arbitrarily determined by the manufacturer. For example, the manufacturer may select an ADC suitable for the most-used frequency and bandwidth in the market. In other examples, a user may select to use an ADC by a saved value at the next power-up of the test device 106 or to use the ADC set by the manufacturer.

Figure 4:
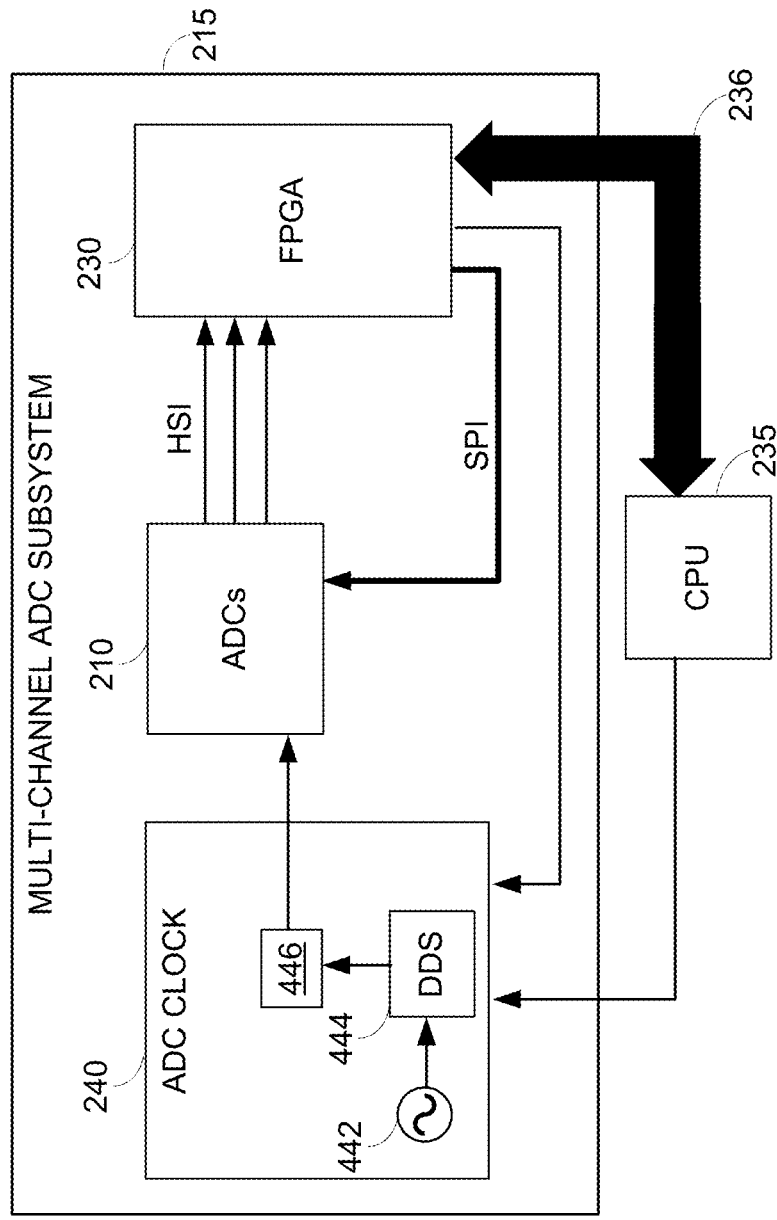
FIG. 4 illustrates a diagram of the multi-channel ADC subsystem managed by the FPGA with an adjustable ADC sample clock, according to an example.

FIG. 4 illustrates a diagram 400 of the multi-channel ADC subsystem 215 managed by the FPGA 230 with an adjustable ADC sample clock 240, according to an example. Diagram 400 shows the multi-channel ADC subsystem 215 managed by the FPGA 230, such as any of the multi-channel ADC subsystems and the FPGAs discussed above. The multi-channel ADC subsystem 215 may include any number of multi-channel ADCs. The ADCs 210 may operate receiving clock frequency(ies) from the ADC sample clock 240, which may include, among other components, an oscillator 442, a direct digital synthesizer 444, and a low-pass or band-pass filter 446.

The CPU 235 may control the ADC sample clock 240 in providing respective clock signals to the selected ADCs. In some examples, the FPGA 230 may also control the ADC sample clock 240. The CPU 235 may further receive digitized (and/or processed) data from the FPGA 230 over PCI interface (interconnect 236).

As mentioned herein, the FPGA 230 may manage the multi-channel ADC subsystem 215 over SPI selecting one or more suitable ADCs based on the ADC characteristics (resolution, SINAD, ENOB, SNR, THD, THD+N, and/or SFDR), a frequency and a bandwidth of the input signals. In some examples, the FPGA 230 may also select particular inputs of an ADC instead of or in addition to the selection of ADCs. Once the ADC(s) have been selected, the FPGA 230 (or the CPU 235) may also set clock frequencies to be provided to the selected ADC(s) by the ADC sample clock 240.

Figure 5:
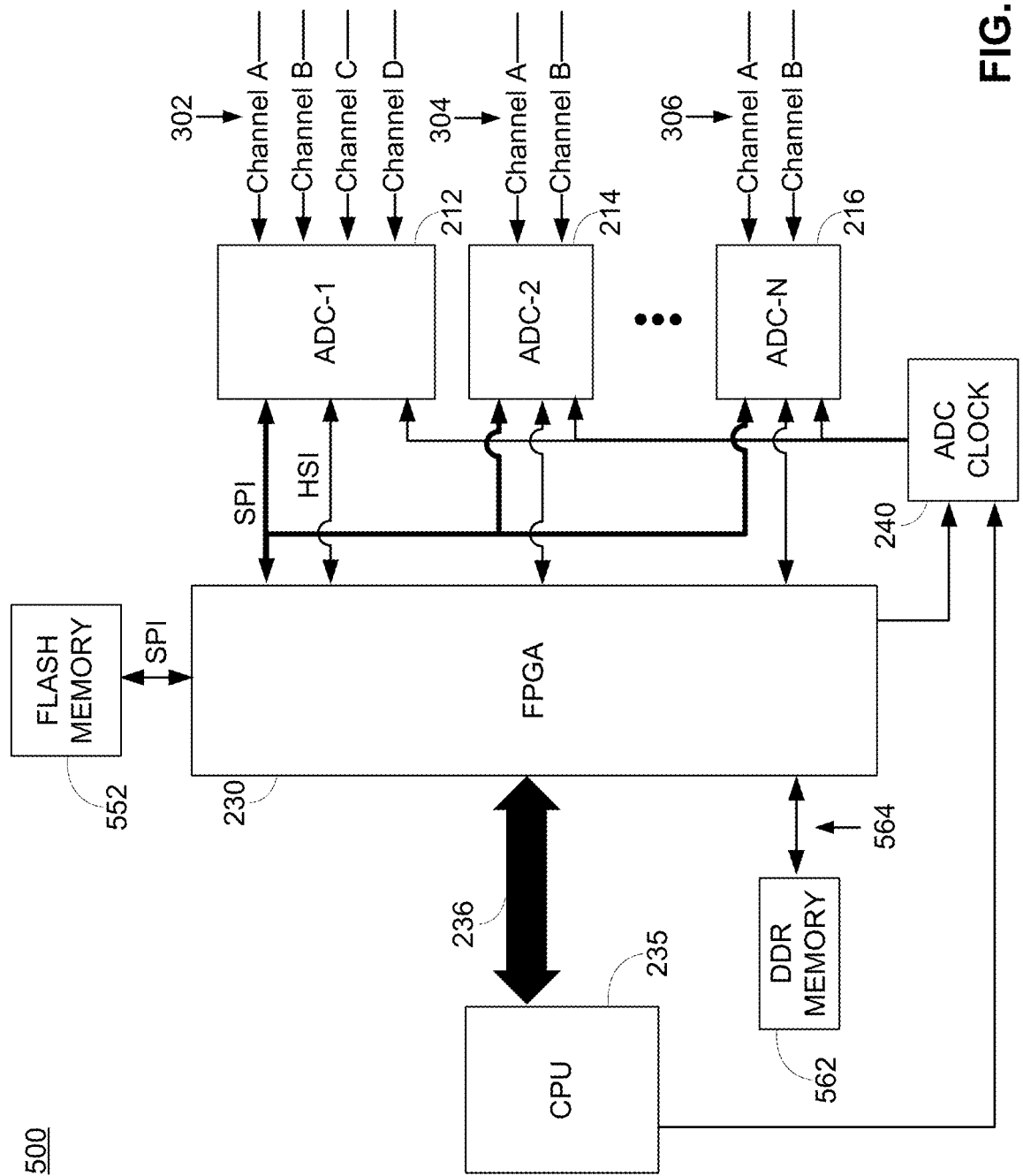
FIG. 5 illustrates a diagram of the multi-channel ADC subsystem managed by the FPGA, according to an example.

FIG. 5 illustrates a diagram 500 of the multi-channel ADC subsystem managed by the FPGA, according to an example. The components shown in diagram 500 may be used with similar components shown in FIGS. 2 and/or 3. As shown in diagram 500, multiple input signals may be received at a multiple channel test device (spectrum analyzer) and corresponding down-converted signals may be forwarded by a mixer to ADCs in the multi-channel ADC subsystem simultaneously. For example, four inputs may be forwarded as channels A, B, C, and D (302) to ADC-1 212, or the four inputs may be forwarded as channels A and B (304 and 306) to two different ADCs, ADC-2 214 and ADC-N 216.

In some examples, the FPGA 230 may receive multiple digitized signals from the selected ADCs simultaneously, and cache and process the signals received in parallel. In other examples, the FPGA 230 may receive the digitized signals in series and process them as the signals are received. The CPU 235 may receive digitized (and/or processed) data from the FPGA 230 over PCI interface (interconnect 236). The CPU 235 and/or the FPGA 230 may control the ADC sample clock 240 in providing respective clock signals to the selected ADCs.

As in the practical implementation example of FIG. 3, channel A may be 2195 MHz (with a bandwidth of 800 MHz), channel B may be 1200 MHz (with a bandwidth of 400 MHz), channel C may be 370 MHz (with a bandwidth of 200 MHz), and channel D may be 185 MHz (with a bandwidth of 100 MHz), all of which may be provided to a 4-channel ADC (ADC-1 212). In another practical implementation example, the 2195 MHz signal (with the bandwidth of 800 MHz) and the 1200 MHz signal (with the bandwidth of 400 MHz) may be provided as channels A and B to ADC-2 214 and the 370 MHz signal (with the bandwidth of 200 MHz) and the 185 MHz signal (with the bandwidth of 100 MHz) may be provided as channels A and B to ADC-N 216.

In some examples, several IF signals may be provided to ADC inputs and processed by the ADC(s) for digital conversion. The converted signals may then be transferred from the ADC(s) through a high-speed data transfer interface (HSI) to the FPGA 230, for example, a JESD204B/C interface. The transferred data may be processed and/or stored by the FPGA 230. The FPGA 230 may store the data in a high-bandwidth random access memory such as Double Data Rate 4 Synchronous Dynamic Random-Access Memory (DDR4 SDRAM) 562. The interface 564 between the DDR4 SDRAM 562 and the FPGA 230 may provide for exchange of data, memory addresses, clock signals, and/or control signals. The FPGA 230 may be configured by a flash memory 552 through a lower bandwidth interface such as SPI.

Figure 6:
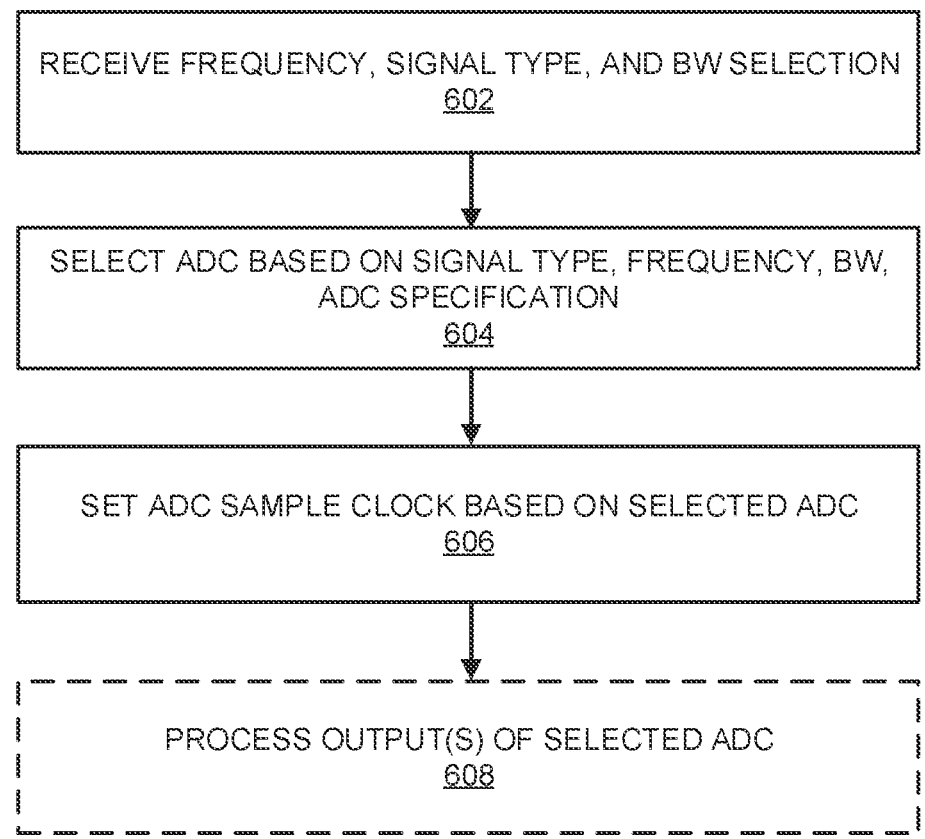
FIG. 6 illustrates a flow chart of a method for employing a multi-channel ADC subsystem managed by an FPGA in a spectrum analyzer, according to an example.

FIG. 6 illustrates a flow chart of a method 600 for employing a multi-channel ADC subsystem 215 managed by an FPGA 230 in a spectrum analyzer, according to an example. The method 600 is provided by way of example, as there may be a variety of ways to carry out the method described herein. Although the method 600 is primarily described as being performed by the circuits of FIGS. 2 and 3, the method 600 may be executed or otherwise performed by one or more processing components of another system or a combination of systems. Each block shown in FIG. 6 may further represent one or more processes, methods, or subroutines, and one or more of the blocks (e.g., the selection process) may include machine readable instructions stored on a non-transitory computer readable medium and executed by a processor or other type of processing circuit to perform one or more operations described herein.

At block 602, the test device 106 may receive one or more input signals with different frequencies, bandwidths, and signal types (e.g., frequency division multiplexing, time division multiplexing, etc. based on a network technology). Along with the input signals, a user selection on the type, frequency, and bandwidth of each received signal may also be received. As mentioned previously, multiple input signals (IF signals) may be received by one or more ADCs simultaneously if the test device includes multiple mixers that can process in parallel. Alternatively, a single mixer may downconvert multiple RF signals to corresponding IF signals and provide to the ADCs serially in a time-multiplexed fashion.

At block 604, one or more suitable ADCs of the multichannel ADC subsystem 215 may be selected based on ADC characteristics (e.g., resolution, SINAD, ENOB, SNR, THD, THD+N, and/or SFDR). For each type of signal, or a combination of two or more signals, a different ADC may provide better performance compared to other available ADCs in the multi-channel ADC subsystem 215. In some examples, all down-converted input signals may be provided to a single ADC (e.g., ADC-1 212). In other examples, some of the down-converted input signals may be provided to one ADC (e.g., ADC-2 214) and remaining down-converted input signals may be provided to another ADC (e.g., ADC-N 216).

At block 606, the ADC sample clock 240 may be set to provide one or more clock frequencies to the selected ADC(s). Depending on the characteristics of the selected ADC(s), the ADC sample clock 240 may provide different clock frequencies in a time-multiplexed manner or simultaneously.

At optional block 608, the selected ADC(s) may convert the provided signals to digital output signals, which may be optionally processed by digital processing circuitry 220 and/or received and used by operational circuits and devices 250 of the test device 106 to perform functions such as FFT analysis, display, storage, etc.

Figure 7:
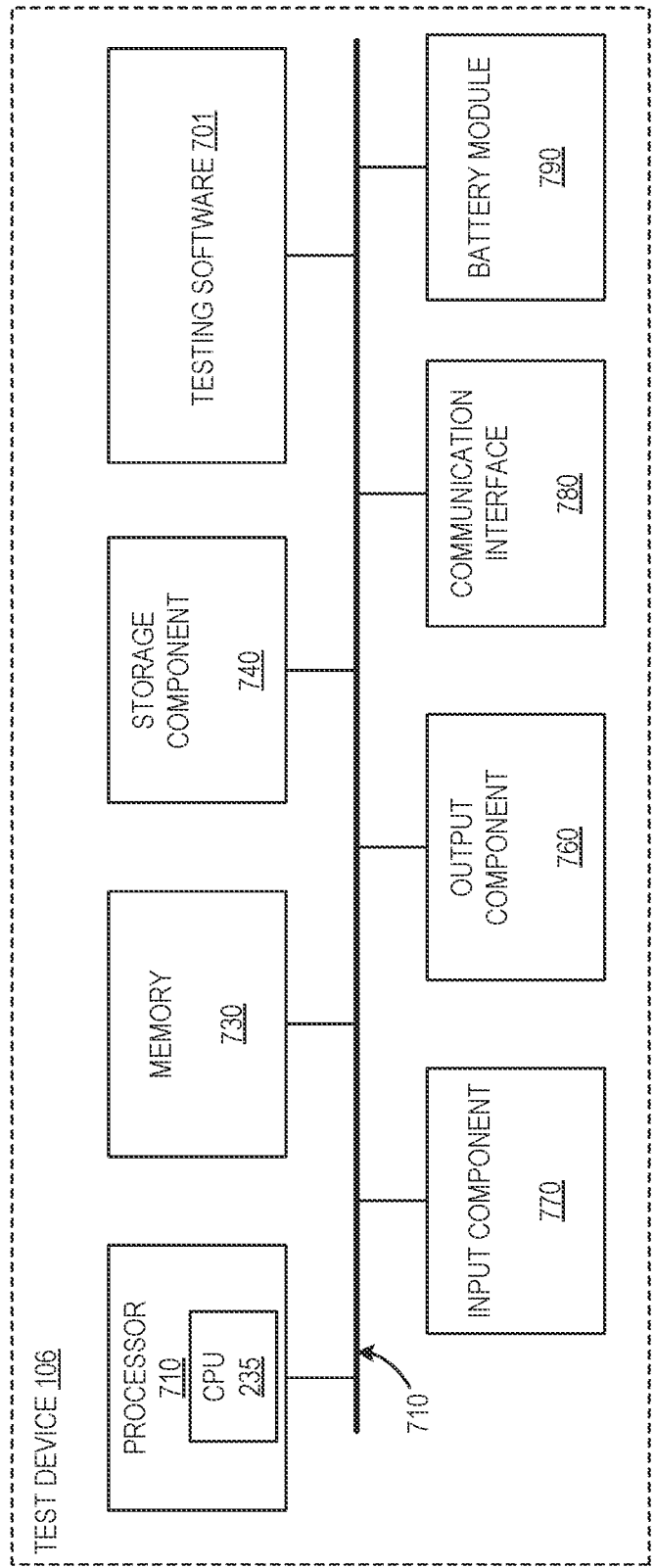
FIG. 7 illustrates a block diagram of the test device, according to an example.

FIG. 7 illustrates a block diagram 700 of the test device 106, according to an example. As shown in block diagram 700, the test device 106 may include the components of FIG. 2 and the components shown in FIG. 7. The test device 106 may include a bus 710, a processor 720, a memory 730, a storage component 740, an input component 770, an output component 760, a communication interface 780, and battery module 790.

Bus 710 includes a component that permits communication among the components of test device 106. Processor 720 may be implemented in hardware, firmware, or a combination of hardware and software. Processor 720 may include one or more of a central processing unit (CPU) 235, a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some examples, processor 720 may include one or more processors capable of being programmed to perform a function. Memory 730 may include one or more memories such as a random access memory (RAM), a read only memory (ROM), and/or another type of dynamic or static storage device (e.g., a flash memory, a magnetic memory, and/or an optical memory) that store information and/or instructions for use by processor 720.

Storage component 740 stores information and/or software related to the operation and use of test device 106. For example, storage component 740 may include a hard disk (e.g., a magnetic disk, solid state disk, etc.) and/or another type of non-transitory computer-readable medium.

Input component 770 may include a component that permits the test device 106 to receive information, such as via user input (e.g., a touch screen display, a keyboard, a keypad, a mouse, a button, a switch, and/or a microphone). Additionally, or alternatively, input component 770 may include a sensor for sensing information (e.g., a GPS component, an accelerometer, a gyroscope, and/or an actuator). Output component 760 includes a component that provides output information from the test device 106 (e.g., a display, a speaker, a user interface, and/or one or more light-emitting diodes (LEDs)). Output component 760 may include a display providing a GUI. Input component 770 and output component 760 may be combined into a single component, such as a touch responsive display, also known as a touchscreen.

Communication interface 780 may include a transceiver-like component (e.g., a transceiver and/or a separate receiver and transmitter) that enables test device 106 to communicate with other devices, such as via a wired connection, a wireless connection, or a combination of wired and wireless connections. Communication interface 780 may permit the test device 106 to receive information from another device and/or provide information to another device. For example, communication interface 780 may include an Ethernet interface, an optical interface, a coaxial interface, an infrared interface, an RF interface, a universal serial bus (USB) interface, a Wi-Fi interface, a cellular network interface, or the like.

Battery module 790 is connected along bus 710 to supply power to processor 720, memory 730, and internal components of the test device 106. Battery module 790 may supply power during field measurements by the test device 106. Battery module 790 may permit the test device 106 to be a portable.

The test device 106 may perform one or more processes described herein. The test device 106 may perform these processes by processor 720 executing software instructions (e.g., testing software 701) stored by a non-transitory computer-readable medium, such as memory 730 and/or storage component 740. A computer-readable medium is defined herein as a non-transitory memory device. A memory device includes memory space within a single physical storage device or memory space spread across multiple physical storage devices.

Software instructions may be read into memory 730 and/or storage component 740 from another computer-readable medium or from another device via communication interface 780. When executed, software instructions stored in memory 730 and/or storage component 740 may instruct processor 720 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The test device 106 may include components other than shown. For example, the test device 106 may include a spectrum analyzer and power meter for performing tests described above. The number and arrangement of components shown in FIG. 7 are provided as an example. In practice, the test device 106 may include additional components, fewer components, different components, or differently arranged components than those shown in FIG. 7. Additionally, or alternatively, a set of components (e.g., one or more components) of the test device 106 may perform one or more functions described as being performed by another set of components of the test device 106.

While specific circuit configurations such as the arrangements of a number of components are shown in conjunction with the test device including a multi-channel ADC subsystem managed by an FPGA herein, the illustrated configurations are not intended to be limiting. A test device employing multi-channels ADCs may be implemented with other configurations and component values using the principles described herein.

While examples described herein are directed to configurations as shown, it should be appreciated that any of the components described or mentioned herein may be altered, changed, replaced, or modified, in size, shape, and numbers, or material, depending on application or use case, and adjusted for desired resolution or optimal measurement results.

It should be appreciated that the apparatuses, systems, and methods described herein may minimize and/or reduce analog-digital conversion errors and inaccuracies due to two or more signals with different characteristic being converted by the same ADC, and thereby facilitate more reliable and accurate RF measurements, specifically for input signals with different frequencies, bandwidths, and types. It should also be appreciated that the apparatuses, systems, and methods, as described herein, may also include, or communicate with other components not shown. For example, these may include external processors, counters, analyzers, computing devices, and other measuring devices or systems. This may also include middleware (not shown) as well. The middleware may include software hosted by one or more servers or devices. Furthermore, it should be appreciated that some of the middleware or servers may or may not be needed to achieve functionality. Other types of servers, middleware, systems, platforms, and applications not shown may also be provided at the backend to facilitate the features and functionalities of the testing and measurement system.

Moreover, single components may be provided as multiple components, and vice versa, to perform the functions and features described herein. It should be appreciated that the components of the system described herein may operate in partial or full capacity, or it may be removed entirely. It should also be appreciated that analytics and processing techniques described herein with respect to the optical measurements, for example, may also be performed partially or in full by other various components of the overall system.

It should be appreciated that data stores may also be provided to the apparatuses, systems, and methods described herein, and may include volatile and/or nonvolatile data storage that may store data and software or firmware including machine-readable instructions. The software or firmware may include subroutines or applications that perform the functions of the measurement system and/or run one or more application that utilize data from the measurement or other communicatively coupled system.

The various components, circuits, elements, components, and interfaces, may be any number of mechanical, electrical, hardware, network, or software components, circuits, elements, and interfaces that serves to facilitate communication, exchange, and analysis data between any number of or combination of equipment, protocol layers, or applications. For example, the components described herein may each include a network or communication interface to communicate with other servers, devices, components or network elements via a network or other communication protocol.

What has been described and illustrated herein are examples of the disclosure along with some variations. The terms, descriptions, and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

The invention claimed is:

1. A multi-channel analog-digital converter (ADC) subsystem for a radio frequency (RF) test device, comprising:
a plurality of multi-channel ADCs to receive one or more down-converted signals and convert the one or more received signals to one or more digital output signals;
a field programmable gate array (FPGA) to select one or more ADCs among the plurality of ADCs based, at least in part, on a characteristic of each received signal and a characteristic of each ADC among the plurality of ADCs; and
an ADC sample clock to provide a clock signal to the selected one or more ADCs.

2. The multi-channel ADC subsystem of claim 1, wherein the characteristic of each received signal comprises one or more of a frequency, a bandwidth, and a signal type.

3. The multi-channel ADC subsystem of claim 1, wherein the characteristic of each ADC among the plurality of ADCs comprises one or more of a resolution, a signal-to-noise-and-distortion ratio (SINAD), an effective number of bits (ENOB), a signal-to-noise ratio (SNR), a total harmonic distortion (THD), a total harmonic distortion plus noise (THD+N), and a spurious free dynamic range (SFDR).

4. The multi-channel ADC subsystem of claim 1, wherein a frequency of the clock signal to be provided to the selected one or more ADCs is selected based on a type of the selected one or more ADCs.

5. The multi-channel ADC subsystem of claim 4, wherein the frequency of the clock signal is selected by a central processing unit (CPU) of the RF test device or the FPGA.

6. The multi-channel ADC subsystem of claim 1, wherein the ADC sample clock comprises an oscillator, a direct digital synthesizer, and a filter.

7. The multi-channel ADC subsystem of claim 1, wherein the FPGA is further to select one or more inputs of a selected ADC to receive the one or more down-converted signals.

8. A test device to analyze radio frequency (RF) signals, comprising:
a front end to receive one or more RF signals and pre-process the received RF signals;
a mixer to down-convert the pre-processed RF signals;
a multi-channel analog-digital converter (ADC) subsystem to receive the down-converted signals from the mixer and convert to digital output signals, wherein the multi-channel ADC subsystem comprises:
a plurality of multi-channel ADCs;
a field programmable gate array (FPGA) to select one or more ADCs among the plurality of ADCs based, at least in part, on a characteristic of each received RF signal and a characteristic of each ADC among the plurality of ADCs; and an ADC sample clock to provide a clock signal to the selected one or more ADCs; and one or more operational subsystems to perform analytical operations on the digital output signals.

9. The test device of claim 8, wherein the front end comprises an attenuator and a filter.

10. The test device of claim 8, wherein the one or more operational subsystems include at least one of a display subsystem, an analysis subsystem, a fast Fourier transform (FFT) subsystem, or a storage subsystem.

11. The test device of claim 8, wherein the characteristic of each received RF signal comprises one or more of a frequency, a bandwidth, and a signal type.

12. The test device of claim 8, wherein the characteristic of each ADC among the plurality of ADCs comprises one or more of a resolution, a signal-to-noise-and-distortion ratio (SINAD), an effective number of bits (ENOB), a signal-to-noise ratio (SNR), a total harmonic distortion (THD), a total harmonic distortion plus noise (THD+N), and a spurious free dynamic range (SFDR).

13. The test device of claim 8, wherein a frequency of the clock signal to be provided to the selected one or more ADCs is selected based on a type of the selected one or more ADCs.

14. The test device of claim 8, wherein the FPGA comprises one or more digital processing circuitry to receive and process the digital output signals.

15. The test device of claim 8, wherein the test device is a spectrum analyzer.

16. A method, comprising:

receiving one or more down-converted signals from a mixer of a test device;

selecting, by a field programmable gate array (FPGA) of the test device, one or more analog-digital converters (ADCs) among a plurality of ADCs based, at least in part, on a characteristic of each received RF signal and a characteristic of each ADC among the plurality of ADCs; and converting the one or more down-converted signals to digital output signals using the selected one or more ADCs.

17. The method of claim 16, further comprising:

selecting one or more inputs of a selected ADC to receive the one or more down-converted signals.

18. The method of claim 17, further comprising:

receiving a frequency and a bandwidth associated with an input RF signal from a user; and selecting the one or more ADCs or the one or more inputs of a selected ADC based, at least in part, on the received frequency and bandwidth from the user.

19. The method of claim 18, further comprising:

selecting the one or more ADCs or the one or more inputs of the selected ADC by employing a matching table stored in the FPGA.

20. The method of claim 16, wherein the characteristic of each received RF signal comprises one or more of a frequency, a bandwidth, and a signal type, and the characteristic of each ADC among the plurality of ADCs comprises one or more of a resolution, a signal-to-noise-and-distortion ratio (SINAD), an effective number of bits (ENOB), a signal-to-noise ratio (SNR), a total harmonic distortion (THD), a total harmonic distortion plus noise (THD+N), and a spurious free dynamic range (SFDR).

\* \* \* \* \*